United States Patent [19]

Burdick

[11] 4,233,524
[45] Nov. 11, 1980

[54] MULTI-FUNCTION LOGIC CIRCUIT

[75] Inventor: Edward J. Burdick, Los Gatos, Calif.

[73] Assignee: National Semiconductor Corporation, Santa Clara, Calif.

[21] Appl. No.: 926,873

[22] Filed: Jul. 24, 1978

[51] Int. Cl.³ .............. H03K 19/088; H03K 19/094; H03K 19/20

[52] U.S. Cl. .................. 307/205; 307/207; 307/215; 307/216; 307/218

[58] Field of Search .......... 307/203, 205, 207, 213, 307/215, 216, 279, 289, 291

[56] References Cited

U.S. PATENT DOCUMENTS

| | | | |
|---|---|---|---|
| 3,413,488 | 11/1968 | Yee | 307/216 |
| 3,460,132 | 8/1969 | Juliusburger et al. | 307/216 X |
| 3,602,732 | 8/1971 | Suzuki | 307/205 |
| 3,666,968 | 5/1972 | Krocheski et al. | 307/291 X |
| 3,668,425 | 6/1972 | Schmidt, Jr. | 307/205 X |
| 3,683,202 | 8/1972 | Schmidt, Jr. | 37/215 X |
| 3,691,401 | 9/1972 | Forlani et al. | 307/207 X |
| 3,965,367 | 6/1976 | Mei | 307/215 X |
| 3,980,897 | 9/1976 | Arnold | 307/205 |
| 4,006,365 | 2/1977 | Marzin et al. | 307/216 X |

OTHER PUBLICATIONS

Lau et al., "Inverse Exclusive OR Circuit for Dynamic Logic", *IBM Tech. Discl. Bull.;* vol. 17, No. 6, pp. 1666–16667, 11/1974.
Hansen, "Exclusive-OR with PNP Amplifier", *IBM Tech. Discl. Bull.,* vol. 14, No. 4, p. 1102, 9/1971.
Swietek, "Antisaturation Clamp for XOR Circuit", *IBM Tech. Discl. Bull.,* vol. 18, No. 8, p. 2508, 1/1976.
Hansen, "Exclusive OR Circuit", *IBM Tech. Discl. Bull.,* vol. 19, No. 4, pp. 1235–1236, 9/1976.

*Primary Examiner*—Larry N. Anagnos
*Attorney, Agent, or Firm*—Brown & Martin

[57] ABSTRACT

Disclosed are multi-function logic circuits which simultaneously receive data signals and control signals. The control signals select logic operations for the multi-function logic circuits to perform on the data signals. Output logic signals, representing the result of the selected logical operation, are generated by the circuits. A four transistor embodiment selectively performs an EXCLUSIVE OR, OR, and NAND operation. A six transistor embodiment selectively performs a FULL ADD, NOR, OR NAND, and AND operation. The six transistor embodiment is suitable for use as an arithmetic logic unit in a digital computer.

11 Claims, 6 Drawing Figures

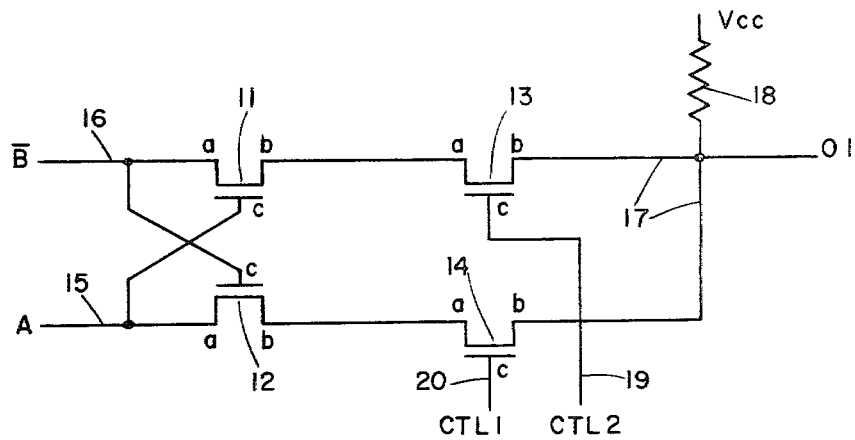
Fig. 1
| $\overbrace{\phantom{xx}}^{30}$ | $\overbrace{\phantom{xx}}^{31}$ | $\overbrace{\phantom{xxxxxxxxxxxxxxxxxx}}^{32}$ |
|---|---|---|
| CTL 1 | CTL 2 | O1 |
| H | H | $L = A \cdot \overline{\overline{B}} + \overline{A} \cdot \overline{B}$, $H = A \oplus B$, (EXCLUSIVE OR) |
| H | L | $L = \overline{A} \cdot \overline{B}$ , $H = A + B$, (OR) |
| L | H | $L = A \cdot B$ , $H = \overline{A \cdot B}$ , (NAND) |
Fig. 2
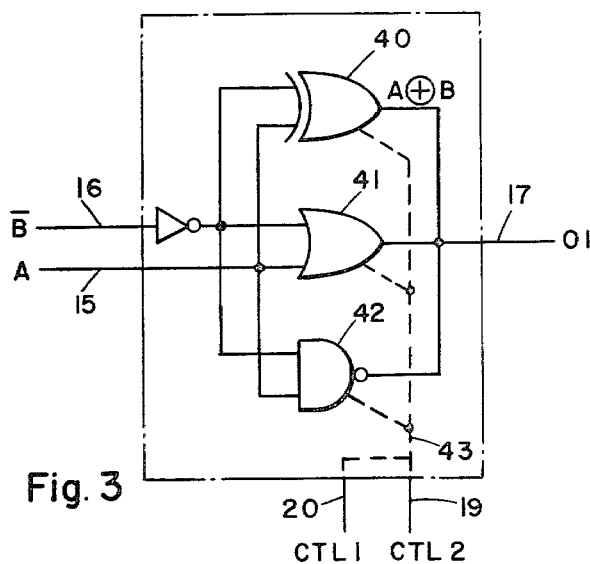
Fig. 3

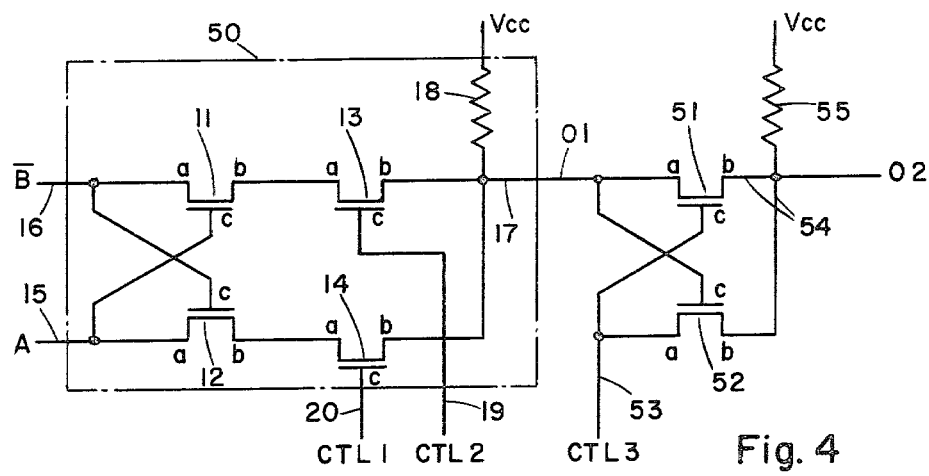
Fig. 4
| CTL1 60 | CTL2 61 | CTL3 62 | O2 63 | |
|---|---|---|---|---|
| H | H | $\overline{C}$ | $H = A \oplus B \oplus C$ | (FULL ADD) |
| H | L | L | $H = \overline{A+B}$ | (NOR) |
| H↓ | L↓ | H | $H = A + B$ | (OR) |
| L | H | H | $H = \overline{A \cdot B}$ | (NAND) |
| L↓ | H↓ | L | $H = A \cdot B$ | (AND) |
Fig. 5
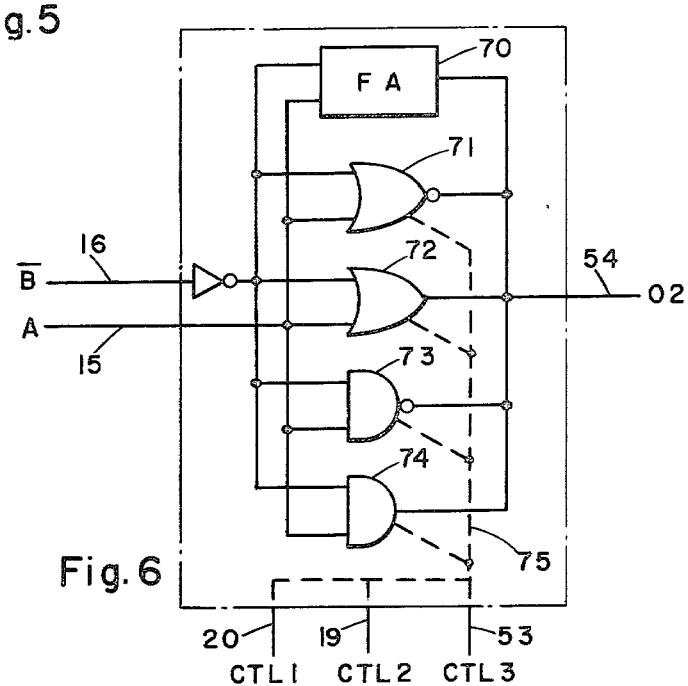
Fig. 6

MULTI-FUNCTION LOGIC CIRCUIT

BACKGROUND OF THE INVENTION

The disclosed invention relates to logic circuits, and more particularly to logic circuits for performing selectable logic operations. In the prior art, a variety of logic circuits exist for performing single logic operations. These logical operations include a logical AND, OR, NAND, NOR, and FULL ADD. Typically in the past, five separate gates would be required to perform all of these functions. That is, each of the five gates would perform only one function.

Performing separate logic functions by separate gates however, is not a particularly attractive way to meet many logic design requirements. For example, one common requirement is to selectively perform different logical operations on a pair of input signals at different time intervals. In the past, this requirement was met by having one gate connected to receive the input signals for each logical operation that was to be performed. The desired output of these gates was then selectively time multiplexed onto a single output lead by additional AND-OR gates. This solution is not attractive however, because it requires too many gates to implement. On a monolithic integrated circuit, this translates to wasted chip area.

To overcome such problems, there exists in the prior art a multi-function gate as described in the U.S. Pat. No. 3,691,401 which was issued Sept. 12, 1972 to inventors Felimmi and Rogari. This patent discloses a logic circuit which selectively functions as a NAND gate or a NOR gate in response to a command signal. One problem with this circuit however, is that the functions which it selectively performs are too limited. Specifically, this circuit does not operate to perform logical AND, OR, EXCLUSIVE OR, or FULL ADD. In addition, another problem with the patented circuit is that the number of transistors required to perform the two functions is too large. For example, in the disclosed minimum transistor configuration, five transistors are required to perform only a NAND and NOR function.

Therefore, it is one object of the invention to provide an improved multifunction logic circuit.

Another object of the invention is to provide a four transistor logic circuit capable of selectively performing three logical operations.

Another object of the invention is to provide a six transistor logic circuit capable of selectively performing five logical operations.

Still another object of the invention is to provide a six transistor logic circuit suitable for use as an arithmetic logic unit in a digital computer.

SUMMARY OF THE INVENTION

These and other objects are accomplished in accordance with the invention by circuits comprised of four switching elements such as four transistors. Input terminals and control terminals of first and second ones of the transistors are cross-coupled together, and to respective leads for inputting data signals thereon. Output terminals of the first and second transistors couple to respective input terminals of third and fourth transistors; and output terminals of the third and fourth transistors are coupled together and selectable output logic signals are generated thereon. Control terminals on the third and fourth transistor couple to respective control leads to receive control signals which select the logic function to be performed. The second embodiment includes the first embodiment and further includes fifth and sixth transistors having input terminals and control terminals cross-coupled together. The input terminal of the fifth transistor further couples to the output terminal of the third and fourth transistor, and the input terminal of the sixth transistor further couples to an input lead for receiving both data and control signals thereon. Output terminals of the fifth and sixth transistors couple together and selectable logic function signals are generated thereon.

BRIEF DESCRIPTION OF THE DRAWINGS

The novel features believed characteristic of the invention are set forth in the appended claims. The invention itself, however, as well as other features and advantages thereof, will best be understood by reference to the following detailed description of particular embodiments when read in conjunction with the accompanying drawings wherein:

FIG. 1 is a detailed circuit diagram of a first embodiment of the invention.

FIG. 2 is a truth table describing the operation of the circuit of FIG. 1.

FIG. 3 is a logic diagram of the circuit of FIG. 1.

FIG. 4 is a detailed circuit diagram of a second embodiment of the invention.

FIG. 5 is a truth table describing the invention of the circuit of FIG. 4.

FIG. 6 is a logic diagram of the circuit of FIG. 4.

DETAILED DESCRIPTION OF THE DRAWINGS

A first embodiment of a multi-function logic circuit constructed according to the invention will now be described in conjunction with FIGS. 1-3. Referring first to FIG. 1, a detailed circuit diagram of the first embodiment is illustrated. This circuit includes four switching devices 11-14. In the preferred illustrated embodiment, switching devices 11-14 each consist of a single MOS Field Effect transistor. Alternatively, for example, each of the switching devices 11-14 may be comprised of a single bi-polar transistor. In general, each of the switching devices have respective input terminals, output terminals, and control terminals which are respectively designated in FIG. 1 via letters a, b, c. In operation, signals on input terminals a are coupled to output terminal b in response to logic signals applied to control lead c.

Switching devices 11 and 12 have their input terminals and control terminals cross-coupled to each other and to respective leads 15 and 16 for receiving data logic signals thereon. Data logic signal A is received on lead 15; while data logic signal $\overline{B}$ is received on lead 16. The output terminals of switching devices 11 and 12 couple respectively to the input terminals of switching devices 13 and 14; and the output terminals of switching devices 13 and 14 couple together via a lead 17. Multi-function logic output signals O1 are generated thereon. Lead 17 couples to a voltage source Vcc through a resistive load 18. Suitably, load 18 may be comprised of an MOS Field Effect transistor having its gate coupled to its source. The control terminal of switching device 14 is coupled to receive a control logic signal CTL1 via a lead 20, whereas the control terminal of switching device 13 is coupled to receive a control logic signal CTL2 via a lead 19.

The functional operation of the circuit of FIG. 1 will now be described in conjunction with the truth table of FIG. 2. That truth table contains columns 30-32 of information. Columns 30 and 31 list the state of logic signals CTL1 and CTL2; while column 32 lists the corresponding multi-function output signal O1. When the control CTL1 and CTL2 signals are both high, the output terminals b of switching devices 11 and 12 are both coupled to lead 17. Under this condition, signals on lead 17 are low when A is high and $\overline{B}$ is low, or when A is low and $\overline{B}$ is high. Thus a high signal on lead 17 represents the exclusive lower of logic signals A and $\overline{B}$. In comparison, when logic signals CTL1 and CTL2 are respectively at high and low logic levels, only output terminal b of switching device 12 is connected to lead 17. And a high logic signal of lead 17 represents the logic OR of signals A and $\overline{b}$. Further, when signals CTL1 and CTL2 are respectively at logical low and a logical high levels, only output terminal b of switching devices 11 couples to lead 17. Under this condition, a high logic signal on lead 17 represents the logical NAND condition of signals A and $\overline{B}$. Thus, while utilizing only a total of four switching devices, a logic circuit is constructed which selectively performs an EXCLUSIVE OR operation, an OR operation, and a NAND operation.

FIG. 3 is a logic diagram of the circuit of FIG. 1. Included therein is an EXCLUSIVE OR gate 40, an OR gate 41, and a NAND gate 42. Gates 40-42 are selectively enabled via signals CTL1 and CTL2. These signals couple to gates 40-42 via interconnection 43. Reference numerals 15-17 and 19-20 indicate corresponding points between the logic diagram of FIG. 3 and the circuit diagram of FIG. 1.

A second embodiment of a multi-function logic circuit will now be described in conjunction with FIGS. 4-6. FIG. 4 is a detailed circuit diagram of this second embodiment. A portion 50 of this second embodiment is identical to the previously described circuit of FIG. 1. Reference numerals 11-20 indicate the corresponding parts. The second embodiment further includes fifth and sixth switching devices 51 and 52 which are identical in construction to switching devices 11-14. The input terminals and control terminals of switching devices 51 and 52 cross-couple to each other. The input terminal of switching device 51 further couples to lead 17; and the input lead of switching device 52 further couples to a lead 53 for receiving a control logic signal CTL3 thereon. The output terminals of switching devices 51 and 52 couple together via a lead 54. A second multi-function logical output signal O2 is generated thereon. Lead 54 also couples to a voltage course Vcc through a resistive load 55, which is identical in construction to resistive load 18.

The operation of the above described circuit is illustrated in the truth table of FIG. 5. This truth table contains columns 60-63 which respectively list the logic state of control signals CTL1, CTL2, CTL3 and output signal O2. As therein indicated, the logic functions of FULL ADD, NOR, OR, NAND, and AND may be selected by appropriately applying control signals CTL1-CTL3 to their respective leads 20, 19 and 53. For example, when control signals CTL1 and CTL2 are both at a logical high, the FIG. 4 circuit acts as a FULL ADDER with the carry-in signal $\overline{C}$ applied to lead 53. Thus in this mode of operation, lead 53 acts as a data input. Alternatively, a NOR function is performed when signals CTL1-CTL3 are respectively high, low, and low; whereas an NAND function is performed when these signals are respectively low, high, high. Further, an OR function is performed when signals CTL1-CTL3 are respectively high, low, high; whereas an AND function is performed when these signals are respectively low, high, low. Thus, the circuit of FIG. 4 selectively performs four logical functions plus a FULL ADD function, and it is implemented with only a total of six switching devices such as six MOSFET transistors.

A logic diagram corresponding to the circuit of FIG. 4 is illustrated in FIG. 6. Included therein are five logic gates 70-74. Gate 70 represents a FULL ADDER. Gates 71-74 respectively are a NOR gate, an OR gate, and a NAND gate, and a NAND gate. These gates are selectively enabled via control signals CTL1-CTL3 which are received on interconnect leads 75. Clearly, the logic diagram of FIG. 6 is only a logical representation of the functions performed by the circuit of FIG. 4. Each of the gates 70-74 do not separately exist as a physical entity, since if they did, the number of switching devices required to implement the functions would be substantially greater than six.

Various detailed embodiments of the invention have now been described. In addition, many modifications may be made to these details without departing from the nature and spirit of the invention. For example, in FIG. 4, output lead 17 may be made available for use along with output lead 54. Further, if MOS Field Effect transistors are utilized as the switching devices, they may be either N-channel or P-channel devices. In addition, Junction Field Effect transistors may be utilized as the switching devices. Therefore, since many changes and modifications may be made to the above described details without departing from the nature and spirit of the invention, it is understood that the invention is not to be limited to said details but is defined by the appended claims.

What I claim is:

1. A multi-function logic circuit for simultaneously receiving data logic signals and control logic signals for performing selectable logical operations on said data logic signals in response to said control logic signals, and for generating output logic signals representing the result of said logical operation, comprising: first, second, third, and fourth switching means, each of said switching means having an input terminal, an output terminal, and a control terminal for switching data logic signals applied to said input terminal to said output terminal in response to control logic signals applied to said control terminal, said input terminals and said control terminals of said first and second switching means being cross-coupled together and coupled to respective input leads for receiving said data logic signals, said output terminals of said first and second switching means being coupled respectively to said input terminals of said third and fourth switching means, said output terminals of said third and fourth switching means being coupled to an output lead for generating said output logic signals thereon, and said control terminals of said third and fourth switching means being coupled to respective control leads for receiving said control logic signals.

2. A logic circuit according to claim 1, wherein each of said switching means is a single MOS Field Effect transistor.

3. A logic circuit according to claim 1, wherein each of said switching means is a single bipolar transistor.

4. A logic circuit according to claim 1, wherein said logic circuit is integrated on a single semiconductor chip.

5. A logic circuit according to claim 1, and further comprising: fifth and sixth switching means, each of which is identical in construction to said first through fourth switching means, said input terminals and said control terminals of said fifth and sixth switching means being cross-coupled together, said input terminal of said fifth switching means being coupled to said output lead, said input terminal of said sixth switching means being coupled to an input lead for said control logic signals, and said output terminals of said fifth and sixth switching means being coupled to a second output lead for generating second output logic signals thereon.

6. A logic circuit according to claim 5, wherein each of said switching means is a single MOS Field Effect transistor.

7. A logic circuit according to claim 5, wherein each of said switching means is a single bipolar transistor.

8. A logic circuit according to claim 5, wherein said logic circuit is integrated on a single semiconductor chip.

9. A logic circuit according to claim 5, wherein said second output lead is coupled to a second voltage source through a resistive load.

10. A logic circuit according to claim 1, wherein said output lead is coupled to a voltage source through a resistive load.

11. A logic circuit according to claims 10 or 9 wherein the resistive load is an MOS Field Effect transistor having a source, a drain and a gate, said gate being coupled to said source.

* * * * *